United States Patent
Ishii et al.

(10) Patent No.: US 7,465,933 B2
(45) Date of Patent: Dec. 16, 2008

(54) RADIOGRAPHIC IMAGING SUBSTRATE, RADIOGRAPHIC IMAGING APPARATUS, AND RADIOGRAPHIC IMAGING SYSTEM

(75) Inventors: Takamasa Ishii, Honjo (JP); Masakazu Morishita, Hiratsuka (JP); Chiori Mochizuki, Sagamihara (JP); Minoru Watanabe, Honjo (JP); Keiichi Nomura, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/957,843

(22) Filed: Dec. 17, 2007

(65) Prior Publication Data
US 2008/0099688 A1    May 1, 2008

Related U.S. Application Data

(62) Division of application No. 11/683,184, filed on Mar. 7, 2007, now Pat. No. 7,381,965, which is a division of application No. 11/147,182, filed on Jun. 8, 2005, now Pat. No. 7,205,547.

(30) Foreign Application Priority Data
Jun. 15, 2004    (JP) .............................. 2004-177009

(51) Int. Cl.
*G01T 1/20* (2006.01)
*H01L 27/146* (2006.01)

(52) U.S. Cl. .............................. 250/370.11; 250/370.09

(58) Field of Classification Search ............ 250/370.11, 250/370.09
See application file for complete search history.

(56) References Cited

U.S. PATENT DOCUMENTS

| 4,803,536 | A | 2/1989 | Tuan .................... 357/23.13 |
| 6,075,256 | A | 6/2000 | Kaifu et al. ................ 357/53 |
| 7,205,547 | B2 | 4/2007 | Ishii et al. .............. 250/370.09 |

(Continued)

*Primary Examiner*—David P Porta
*Assistant Examiner*—Mindy Vu
(74) *Attorney, Agent, or Firm*—Fitzpatrick, Cella, Harper & Scinto

(57) ABSTRACT

A radiographic imaging apparatus, comprising: a photoelectric conversion substrate including a pixel area where there are arranged a plurality of pixels each formed of a photoelectric conversion element and a switching element connected to the photoelectric conversion element in a matrix formed on an insulating substrate, a bias line for applying a bias to the photoelectric conversion element, a gate line for supplying a driving signal to the switching element, and a signal line for reading electric charges converted in the photoelectric conversion element; a wavelength conversion element for converting radiation to light that can be detected by the photoelectric conversion element, the wavelength conversion element being disposed according to a region including the pixel area; and connection wiring having a photoelectric conversion layer connected to at least a plurality of lines of an identical type of the bias line, the signal line, and the gate line, wherein at least a part of the connection wiring is arranged between the region on the insulating substrate and an edge of the insulating, With this arrangement, it becomes possible to provide a panel for a radiographic imaging apparatus and a radiographic imaging apparatus free from deterioration in device performance and device destruction caused by a static electricity even if a substrate is electricity charged in a manufacturing process.

9 Claims, 17 Drawing Sheets

U.S. PATENT DOCUMENTS

| | | | |
|---|---|---|---|
| 7,381,965 B2* | 6/2008 | Ishii et al. | 250/370.11 |
| 2003/0010899 A1 | 1/2003 | Ishii et al. | 250/214.1 |
| 2003/0190088 A1 | 10/2003 | Kobyashi | 382/275 |
| 2003/0226974 A1* | 12/2003 | Nomura et al. | 250/370.11 |
| 2004/0041097 A1* | 3/2004 | Ishii et al. | 250/370.07 |
| 2004/0101100 A1 | 5/2004 | Morii et al. | 378/98.7 |
| 2006/0062352 A1 | 3/2006 | Nomura | 378/98.8 |
| 2006/0065944 A1 | 3/2006 | Mochizuki | 257/444 |
| 2006/0071251 A1 | 4/2006 | Watanabe et al. | 257/291 |
| 2006/0249763 A1 | 11/2006 | Mochizuki et al. | 257/291 |

* cited by examiner

RADIOGRAPHIC IMAGING SUBSTRATE

RADIOGRAPHIC IMAGING SUBSTRATE

RADIOGRAPHIC IMAGING SUBSTRATE, RADIOGRAPHIC IMAGING APPARATUS, AND RADIOGRAPHIC IMAGING SYSTEM

CROSS-REFERENCE TO RELATED APPLICATION

This application is a divisional of application Ser. No. 11/683,184, filed Mar. 7, 2007, which is a divisional of application Ser. No. 11/147,182, filed Jun. 8, 2005, now U.S. Pat. No. 7,205,547 and claims benefit of the filing date of those applications, and priority benefit of the filing date of Japanese patent application no. 2004-177009, filed Jun. 15, 2004. The entire disclosures of the prior application are incorporated herein by reference.

BACKGROUND OF THE INVENTION

1. Field of the Invention

The present invention relates to a photoelectric conversion substrate, a photoelectric converter, a radiographic imaging substrate, and a radiographic imaging apparatus applied to a medical diagnostic imaging system, a non-destructive inspection device, a radiographic analyzer, or the like. It is assumed in this specification that radiation includes electromagnetic waves including visible light, X rays, alpha rays, beta rays, and gamma rays.

2. Description of the Related Art

As a conventional typical radiographic imaging apparatus, there is a radiographic imaging apparatus constructed of a combination of a radiographic imaging substrate, on which there are arranged optical sensors of MIS-TFT structure each formed of an MIS-type photoelectric conversion element and a switching TFT, and phosphors for converting radiation to visible light. This type of radiographic imaging apparatus is disclosed in U.S. Pat. No. 6,075,256.

FIGS. 13, 14, and 15 show a schematic diagram, an equivalent circuit diagram, and a plan view of a conventional radiographic imaging apparatus, respectively. FIGS. 16 and 17 show a cross section of a single pixel and an enlarged view of a portion close to a cut section of the radiographic imaging substrate.

References P11 to P44 designate photoelectric conversion elements or other semiconductor conversion elements and references T11 to T44 designate thin film transistors (TFTs), and each pair of them forms a pixel. While a pixel area 2 of 4×4 pixels is shown here, for example, 1000×2000 pixels are practically arranged on a radiographic imaging substrate (insulating substrate) 1.

As shown, the photoelectric conversion elements P11 to P44 are connected to common bias lines Vs1 to Vs4 and a readout device applies a given bias to them. The respective gate electrodes of the TFTs are connected to common gate lines Vg1 to Vg4 and a gate drive unit makes an ON-OFF control of the TFT gates. Source or drain electrodes of the TFTs are connected to common signal lines Sig1 to Sig4 and Sig1 to Sig4 are connected to the readout device.

X rays emitted to a subject is attenuated by and passes through the subject and is converted to visible light in a phosphor layer 19 arranged via a adhesive layer 18 shown in FIG. 16. Then, the visible light is incident on the photoelectric conversion elements and converted to electric charges. These charges are transferred to signal lines via the TFTs by means of gate drive pulses applied by a gate drive unit 4 and then read out to the outside by a readout device 5. Thereafter, the common bias lines remove residual charges that have been generated in the photoelectric conversion elements, but have not been transferred.

The conventional radiographic imaging apparatus has a radiographic imaging substrate 1 cut in a cut section indicated by a dashed line in FIG. 17, with the signal lines and the bias lines connected to the readout device 5 and the gate lines connected to the gate drive unit 4 via a printed circuit board such as tape carrier packages (TCPs) 6 and 7, respectively. It is assumed here that TCP-A6 is a TCP connected to the readout device 5 and that TCP-D7 is a TCP connected to the gate drive unit 4.

A layer structure is shown in FIG. 16. An MIS-type photoelectric conversion element is formed of a under electrode (first electrode layer 11), an insulating layer (first insulating layer 12), a photoelectric conversion layer (first semiconductor layer 13), a hole blocking layer (doping semiconductor layer 14), and an upper electrode (second electrode layer 15), with the under electrode (first electrode layer 11) connected to a TFT source-drain electrode (second electrode layer 15). The TFT includes a gate electrode (first electrode layer 11), a gate insulating layer (first insulating layer 12), a semiconductor layer (first semiconductor layer 13), an ohmic contact layer (doping semiconductor layer 14), and a source-drain electrode (second electrode layer 15). Each Vg line and each Sig line are connected to the electrode layer where the TFT gate electrode is formed and to the layer where the source-drain electrode is formed, respectively. Moreover, the photoelectric conversion element and the TFT are coated with and protected by a second insulating layer 16 and an organic protective layer 17. It should be noted here that the first semiconductor layer 13 is formed of an intrinsic semiconductor and that the doping semiconductor layer 14 is formed of an n- or p-type semiconductor to which impurities such as phosphorus or boron have been introduced.

SUMMARY OF THE INVENTION

In recent years, TFT panels can be produced in large quantities due to developments in technologies of manufacturing liquid crystal panels using TFTs and the expansion of the fields into which there have been introduced area sensors having photoelectric conversion elements (for example, am X-ray imaging apparatus).

At the same time, a radiographic imaging apparatus has a characteristic of subjecting minute signals to digital conversion and graphically outputting them, unlike the liquid crystal panels.

Therefore, if a substrate is electrically charged in a manufacturing process, and for example, a potential difference occurs between a signal line and a gate line, a Vth shift occurs in a readout TFT and thereby minute signals cannot be read out.

In case of a large potential difference in the above condition, it causes device destruction and thus leads to deterioration of a yield in a manufacturing line for the mass production.

The present invention provides a radiographic imaging substrate and a radiographic imaging apparatus free from deterioration in device performance and device destruction caused by a static electricity even if a substrate is electrically charged in a manufacturing process.

According to one aspect of the present invention, there is provided a radiographic imaging apparatus, comprising: a photoelectric conversion substrate including a pixel area where there are arranged a plurality of pixels each formed of a photoelectric conversion element and a switching element connected to the photoelectric conversion element in a matrix formed on an insulating substrate, a bias line for applying a bias to the photoelectric conversion element, a gate line for supplying a driving signal to the switching element, and a signal line for reading electric charges converted in the photoelectric conversion element; a wavelength conversion element for converting radiation to light that can be detected by the photoelectric conversion element, the wavelength conversion element being arranged according to a region including the pixel area; and connection wiring having a photoelectric conversion layer connected to at least a plurality of lines of an identical type of the bias line, the signal line, and the gate line, wherein at least a part of the connection wiring is arranged between the region on the insulating substrate and an edge of the insulating substrate.

Furthermore, preferably the connection wiring connects all of the bias lines, the gate lines, and the signal lines.

Still further, preferably the photoelectric conversion element includes at least an under electrode layer, an upper electrode layer, a photoelectric conversion element semiconductor layer arranged between the under electrode layer and the upper electrode layer, and a doping semiconductor layer arranged between the photoelectric conversion element semiconductor layer and the upper electrode layer. The switching element includes at least a first electrode layer, a second electrode layer, a switching element semiconductor layer arranged between the first electrode layer and the second electrode layer, and an ohmic contact layer arranged between the switching element semiconductor layer and the second electrode layer. The connection wiring further includes the doping semiconductor layer or the ohmic contact layer. If it is defined that Ra is a wiring resistance of the bias line, Rb is a wiring resistance of the gate line, Rc is a wiring resistance of the signal line, Rp is a wiring resistance of the photoelectric conversion layer of the connection wiring between the lines under incident light, Rd is a wiring resistance of the photoelectric conversion layer of the connection wiring between the lines under no incident light, Re is a wiring resistance of the doping semiconductor layer of the connection wiring between the lines, and Rf is a wiring resistance of the ohmic semiconductor layer of the connection wiring between the lines, the following relations are satisfied:

Ra, Rb, Rc<Re, Rf<Rd

Ra, Rb, Rc<Re, Rf≦Rp or Ra, Rb, Rc≦Rp<Re, Rf

According to another aspect of the present invention, there is provided a panel for a radiographic imaging apparatus, comprising: a photoelectric conversion substrate including a pixel area where there are arranged a plurality of pixels each formed of a photoelectric conversion element and a switching element connected to the photoelectric conversion element in a matrix formed on an insulating substrate, a bias line for applying a bias to the photoelectric conversion element, a gate line for supplying a driving signal to the switching element, and a signal line for reading electric charges converted in the photoelectric conversion element; and a conductive member having a photoelectric conversion layer connected to at least a plurality of lines of an identical type of the bias line, the signal line, and the gate line, wherein at least a part of the conductive member is arranged between a region including a pixel area where there is arranged a wavelength conversion element on the insulating substrate and an edge of the insulating substrate.

In the panel for the radiographic imaging apparatus of the present invention, preferably the conductive member is a guard ring and there is a cutting position between the guard ring and the pixel area.

According to still another aspect of the present invention, there is provided a method of manufacturing a radiographic imaging apparatus having: a photoelectric conversion substrate including a pixel area where there are arranged a plurality of pixels each formed of a photoelectric conversion element and a switching element connected to the photoelectric conversion element in a matrix formed on an insulating substrate, a bias line for applying a bias to the photoelectric conversion element, a gate line for supplying a driving signal to the switching element, and a signal line for reading electric charges converted in the photoelectric conversion element; a wavelength conversion element for converting radiation to light that can be detected by the photoelectric conversion element, the wavelength conversion element being arranged according to a region including the pixel area; and connection wiring having a photoelectric conversion layer connected to at least a plurality of lines of an identical type of the bias line, the signal line, and the gate line, the method comprising the step of forming at least a part of the connection wiring between the region on the insulating substrate and an edge of the insulating substrate.

According to still another aspect of the present invention, there is provided a method of manufacturing a panel for a radiographic imaging apparatus, the panel having: a photoelectric conversion substrate including a pixel area where there are arranged a plurality of pixels each formed of a photoelectric conversion element and a switching element connected to the photoelectric conversion element in a matrix formed on an insulating substrate, a bias line for applying a bias to the photoelectric conversion element, a gate line for supplying a driving signal to the switching element, and a signal line for reading electric charges converted in the photoelectric conversion element; and a conductive member having a photoelectric conversion layer connected to at least a plurality of lines of an identical type of the bias line, the signal line, and the gate line, the method comprising the step of forming at least a part of the conductive member between a region including a pixel area where there is arranged a wavelength conversion element on the insulating substrate and an edge of the insulating substrate.

In this method of the present invention, preferably the conductive member is a guard ring and the method further includes the step of cutting the insulating substrate between the guard ring and the pixel area.

According to the present invention, there is formed the connection wiring or the conductive member such as the guard ring having at least the photoelectric conversion layer outside the pixel area, and at least two lines of the Vs lines, the Vg lines, and the Sig lines can be connected together via the conductive member, thereby preventing deterioration in device performance and device destruction caused by a static electricity even if the substrate is electrically charged in a manufacturing process.

Further features and advantages of the present invention will become apparent from the following description of exemplary embodiments (with reference to the attached drawings).

DESCRIPTION OF THE EMBODIMENTS

A preferred embodiment of the present invention will be described in detail in accordance with the accompanying drawings.

First Embodiment

Hereinafter, a first embodiment of a radiographic imaging substrate and a radiographic imaging apparatus according to the present invention will be described with reference to accompanying drawings.

Figure 1:
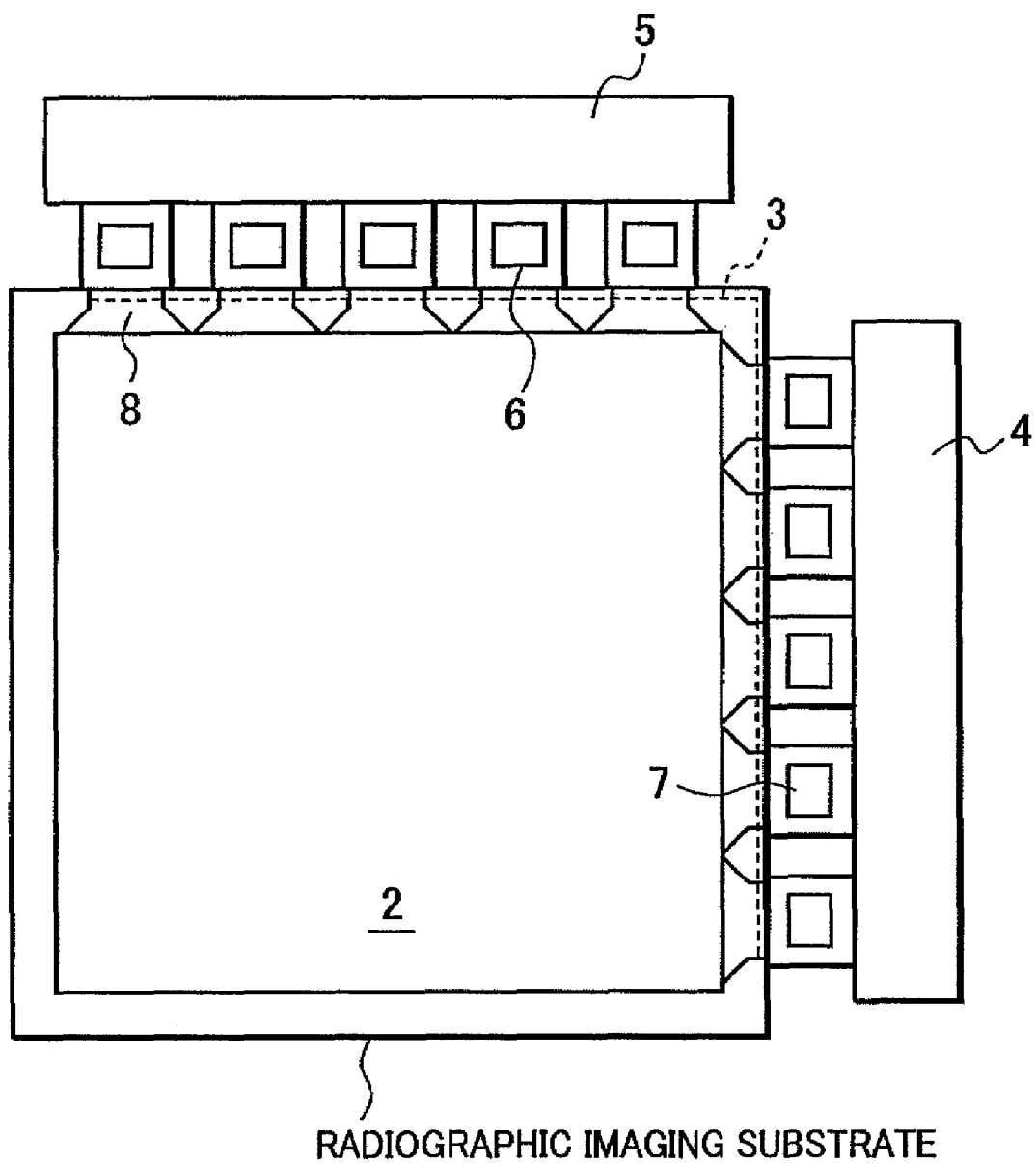
FIG. 1 is a schematic diagram of a radiographic imaging apparatus for explaining a first embodiment of a radiographic imaging substrate and a radiographic imaging apparatus according to the present invention.
Figure 2:
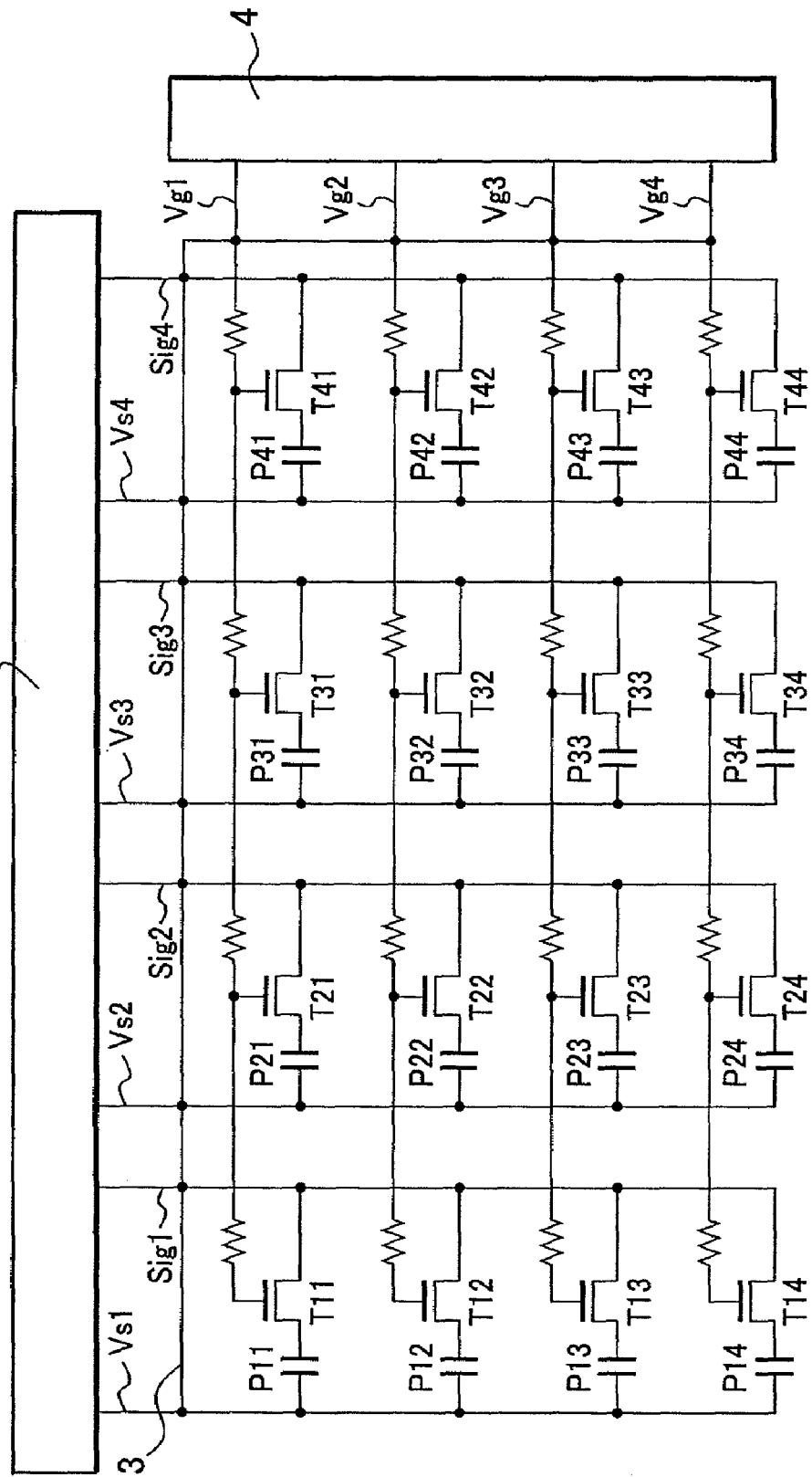
FIG. 2 is an equivalent circuit diagram of the radiographic imaging apparatus for explaining the first embodiment of the radiographic imaging substrate and the radiographic imaging apparatus according to the present invention.
Figure 3:
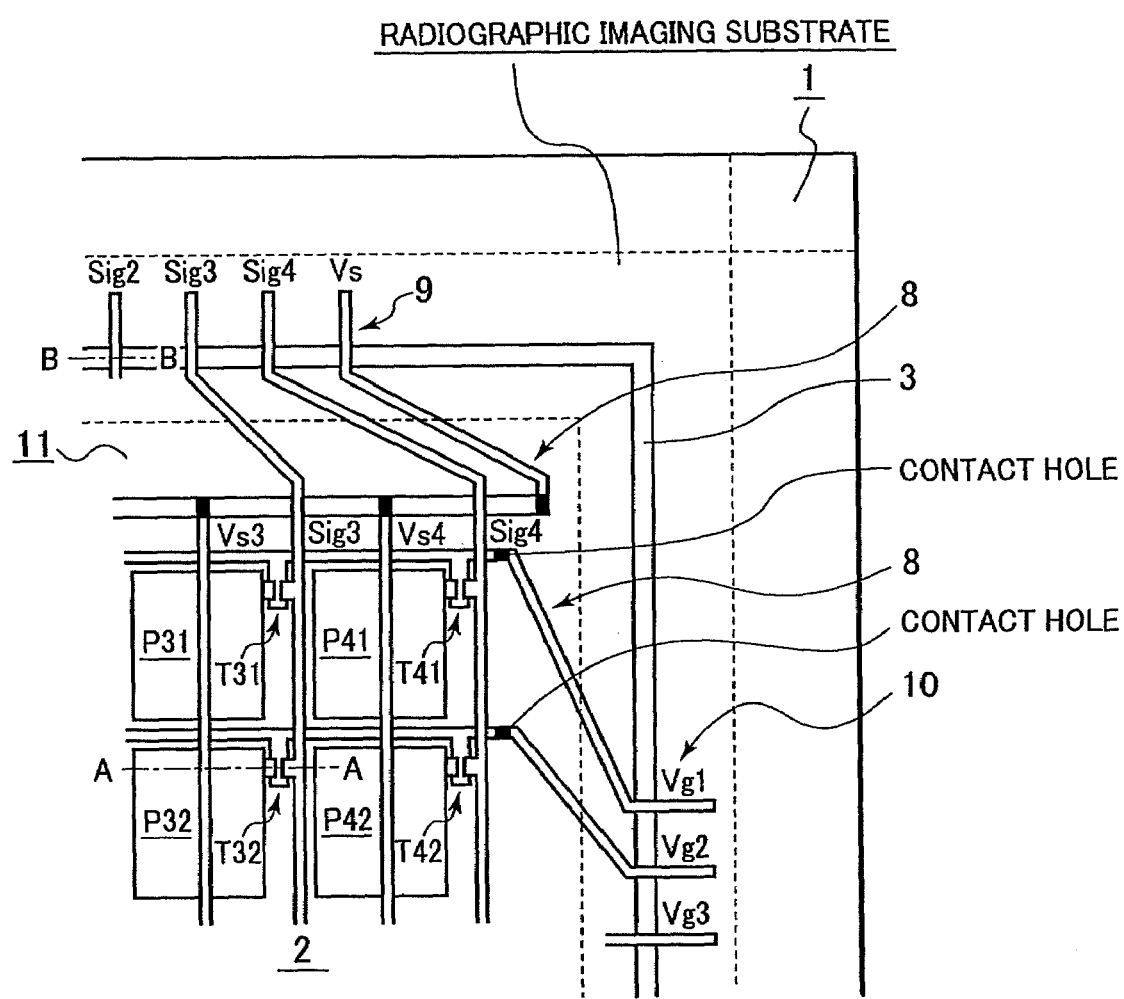
FIG. 3 is an enlarged view of a portion close to a cut section of the radiographic imaging substrate for explaining the first embodiment of the radiographic imaging substrate and the radiographic imaging apparatus according to the present invention.
Figure 4A:
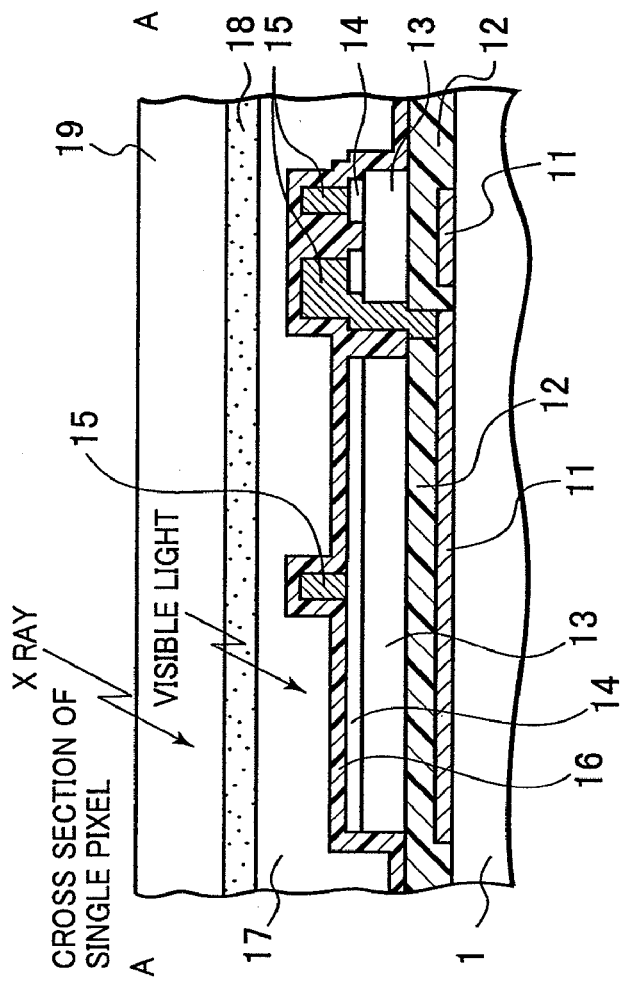
FIG. 4A is a cross section taken on line A-A of FIG. 3 for explaining the first embodiment of the radiographic imaging substrate and the radiographic imaging apparatus according to the present invention.
Figure 4B:
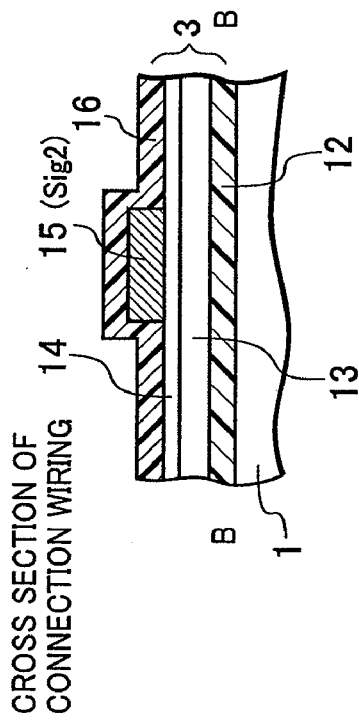
FIG. 4B is a cross section taken on line B-B of FIG. 3 for explaining the first embodiment of the radiographic imaging substrate and the radiographic imaging apparatus according to the present invention.
Figure 5:
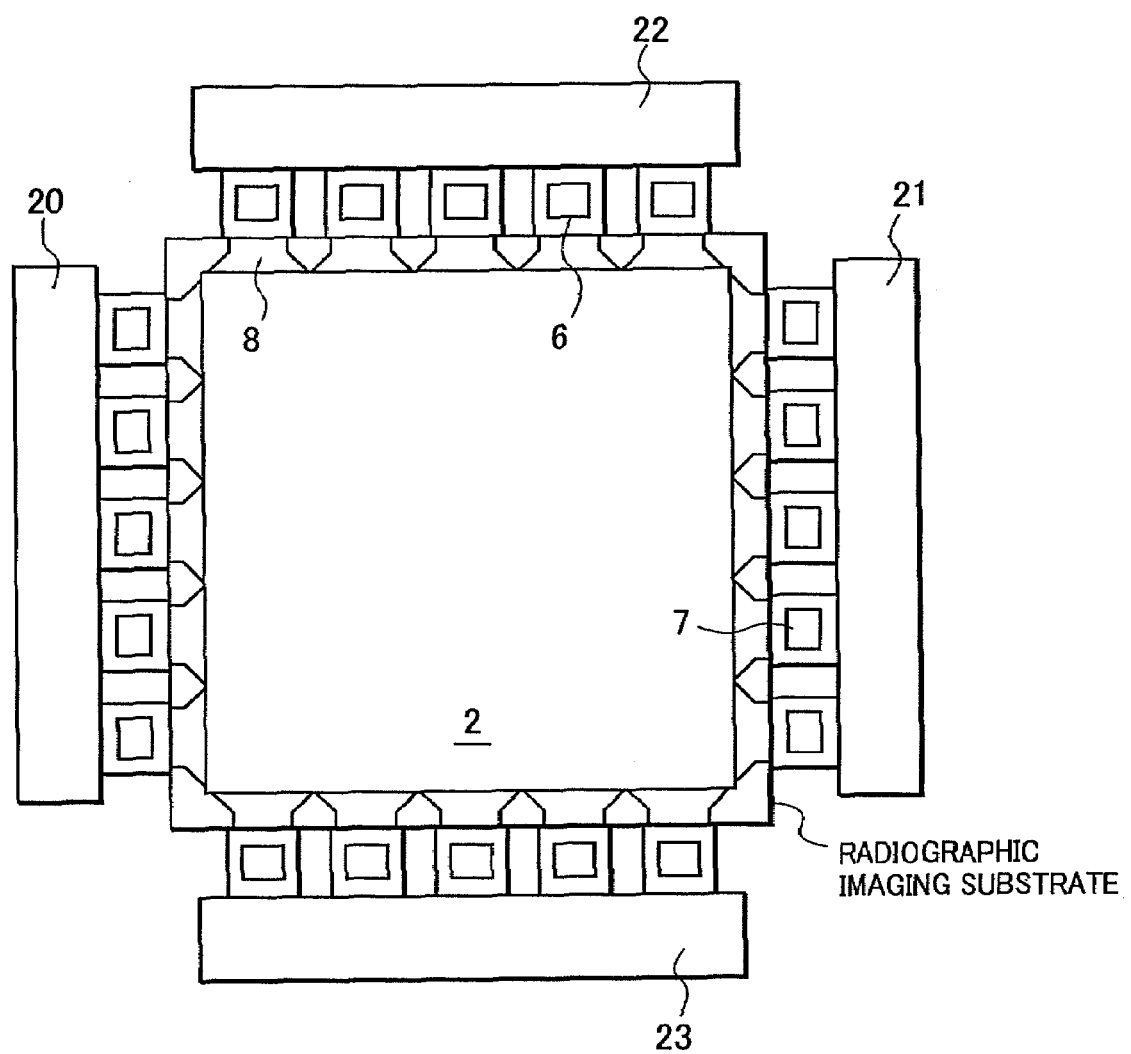
FIG. 5 is a schematic diagram of a radiographic imaging apparatus for explaining a second embodiment of a radiographic imaging substrate and a radiographic imaging apparatus according to the present invention.
Figure 6:
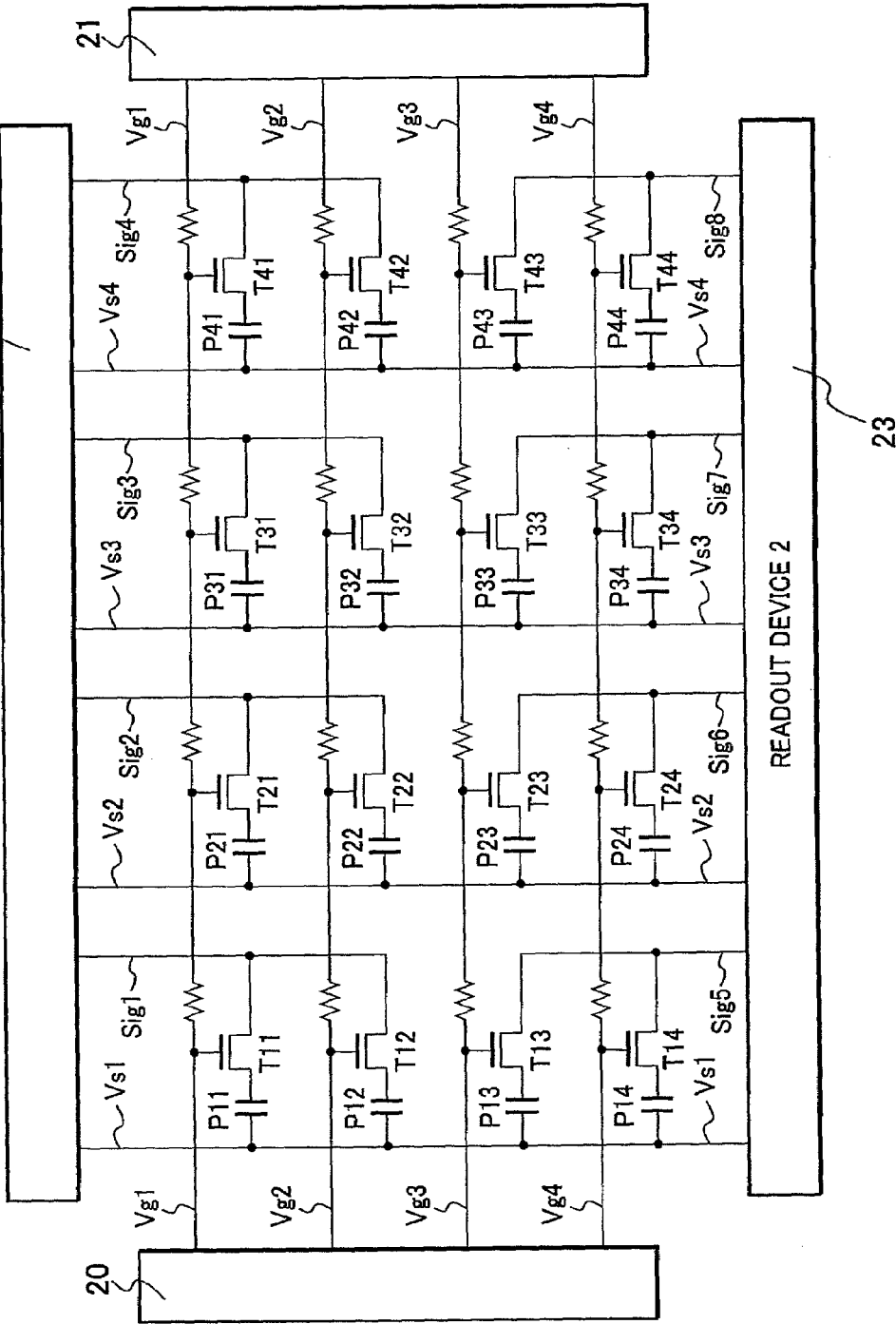
FIG. 6 is an equivalent circuit diagram of the radiographic imaging apparatus for explaining the second embodiment of the radiographic imaging substrate and the radiographic imaging apparatus according to the present invention.

Referring to FIGS. 1, 2, 3, and 4, there are shown a schematic diagram of the radiographic imaging apparatus of the present invention, an equivalent circuit diagram thereof, an enlarged view of a portion close to a cut section of the radiographic imaging substrate (insulating substrate), and cross sections of a single pixel and connection wiring, respectively. Regarding FIG. 4, FIG. 4A shows the cross section of the single pixel (on line A-A of FIG. 3) and FIG. 4B shows the cross section of the connection wiring (on line B-B of FIG. 3).

The radiographic imaging apparatus of the present invention is constructed of a combination of a radiographic imaging substrate, on which there are arranged optical sensors of MIS-TFT structure each formed of an MIS-type photoelectric conversion element and a switching TFT, and phosphors for converting radiation to visible light, and others including a principle of driving are the same as those of the conventional art. Therefore, their description is omitted here.

As shown, gate lines (Vg lines) are formed in a first electrode layer 11 in a pixel area and in a second electrode layer in a TCP-D connection pad portion 10 and are connected together via contact holes. All of bias lines (Vs lines), gate lines (Vg lines), and signal lines (Sig lines) are connected together via connection wiring 3. The connection wiring 3 is arranged in a region between the region 11 where there is formed a phosphor layer 19 including a pixel area 2 and an edge of the insulating substrate.

As shown in FIG. 3, the connection wiring 3 is formed of a first semiconductor layer 13 and a doping semiconductor layer 14 similarly to the MIS-type photoelectric conversion element. Moreover, a hole blocking layer and an ohmic contact layer are the similar doping semiconductor layers 14. The doping semiconductor layer 14 is formed of an n-type semiconductor into which phosphorus as impurity is introduced. If the photoelectric conversion element is of PIN type, the doping semiconductor layer 14 is formed of a p-type semiconductor into which boron is introduced.

It should be noted here that the first semiconductor layer 13 has a characteristic of a high resistance under no incident light and of a low resistance under incident light due to holes and electrons generated in the layer.

Therefore, if it is defined that Ra is a wiring resistance of a bias line (Vs line), Rb is a wiring resistance of a gate line (Vg line), Rc is a wiring resistance of a signal line (Sig line), Rp is a wiring resistance of the first semiconductor layer 13 of the connection wiring 3 between the lines under incident light, Rd is a wiring resistance of the first semiconductor layer 13 of the connection wiring between the lines under no incident light, and Re is a wiring resistance of the doping semiconductor layer 14, the following relations are satisfied:

Ra, Rb, Rc<Re<Rd

Ra, Rb, Rc<Re≦Rp or Ra, Rb, Rc≦Rp<Re

Therefore, for example, even if the insulating substrate 1 is electrically charged in a manufacturing process, the resistance of the connection wiring 3 is low since the product is manufactured in an environment in which light is incident on the insulating substrate 1 and a potential difference between the lines is hard to occur since all of the bias lines (Vs lines), the gate lines (Vg lines), and the signal lines (Sig lines) are connected together via the connection wiring 3. Therefore, it is possible to prevent static electricity generated in the manufacturing process from passing through the lines and damaging the photoelectric conversion elements or the TFTs.

Moreover, the radiographic imaging apparatus with the radiographic imaging substrate 1 has the phosphor layer 19 formed on the region including the pixel area 2 as shown in FIG. 4 and has no phosphor layer 19 on the region where the connection wiring 3 is formed. Therefore, in the radiographic imaging apparatus housed in a cabinet (not shown), no external light nor light emitted from the phosphor layer 19 will be incident on the connection wiring 3, and thus the resistance of the connection wiring 3 is high and they have no influence on the operation of the radiographic imaging apparatus.

Furthermore, a panel inspection using TCP connection pads 9 and 10 is also performed in an environment in which no light is incident on the panel, and therefore the light has no influence on the inspection.

As stated above, the connection wiring 3 having at least a photoelectric conversion layer (first semiconductor layer 13) is formed in a region between the region where there is formed the phosphor layer 19 including the pixel area 2 and the edge of the insulating substrate 1 and the bias lines (Vs lines), the gate lines (Vg lines), and the signal lines (Sig lines) are connected together via the connection wiring 3, thereby offering an effect of preventing deterioration in device performance and device destruction from being caused by static electricity even if the substrate is electrically charged in a manufacturing process.

While the same doping semiconductor layers 14 have been used as the hole blocking layer and the ohmic contact layer in this embodiment, either the hole blocking layer or the ohmic contact layer can be used as the connection wiring 3 if these layers are separate from each other.

Moreover, while the MIS-type photoelectric conversion element has been used as the semiconductor conversion element in this embodiment, the PIN-type photoelectric conversion element is also applicable. Regarding the pixel structure, either type of the following is applicable: a flat type in which a semiconductor conversion element and a switching element are formed in an identical layer and a stacked type in which a semiconductor conversion element is formed on a layer where a switching element is formed.

Second Embodiment

The following describes a second embodiment of a radiographic imaging substrate and a radiographic imaging apparatus according to the present invention with reference to accompanying drawings.

Figure 7:
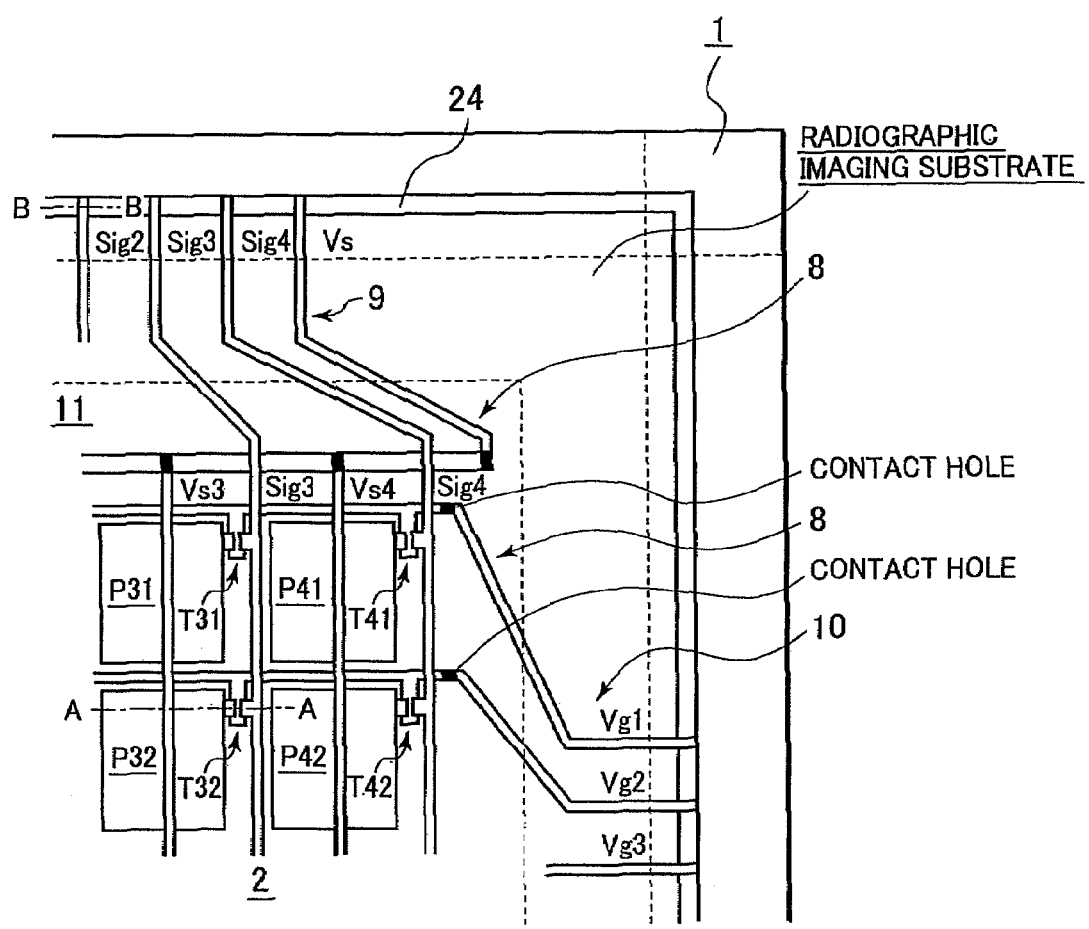
FIG. 7 is an enlarged view of a portion close to a cut section of the radiographic imaging substrate for explaining the second embodiment of the radiographic imaging substrate and the radiographic imaging apparatus according to the present invention.
Figure 8A:
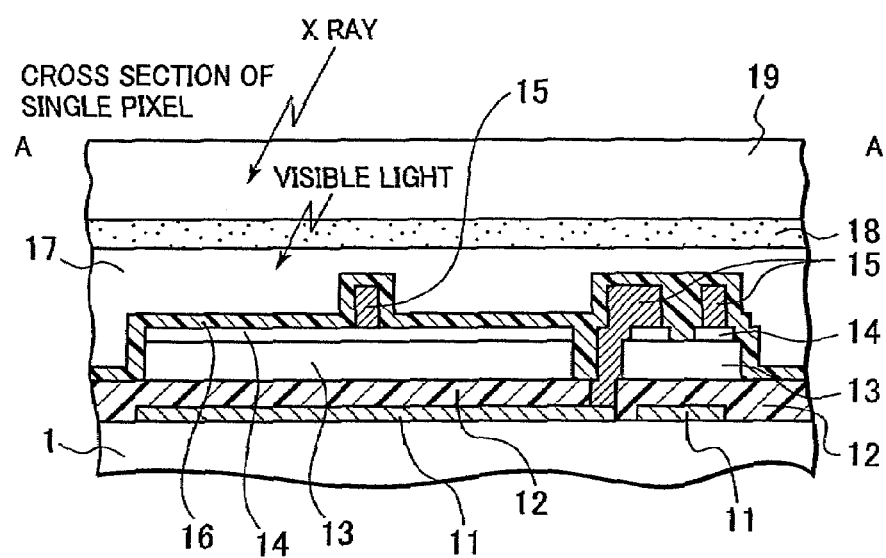
FIG. 8A is a cross section taken on line A-A of FIG. 7 for explaining the second embodiment of the radiographic imaging substrate and the radiographic imaging apparatus according to the present invention.
Figure 8B:
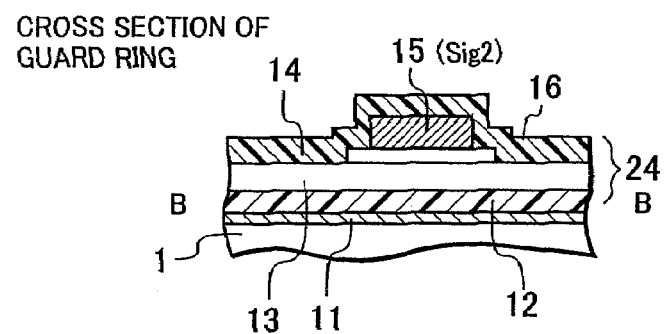
FIG. 8B is a cross section taken on line B-B of FIG. 7 for explaining the second embodiment of the radiographic imaging substrate and the radiographic imaging apparatus according to the present invention.

Referring to FIGS. 5, 6, 7, and 8, there are shown a schematic diagram of the radiographic imaging apparatus of the present invention, an equivalent circuit diagram thereof, an enlarged view of a portion close to a cut section of the radiographic imaging substrate (insulating substrate), and cross sections of a single pixel and a guard ring, respectively. Regarding FIG. 8, FIG. 8A shows the cross section of the single pixel (on line A-A of FIG. 7) and FIG. 8B shows the cross section of the guard ring (on line B-B of FIG. 7).

As shown, references P11 to P44 designate photoelectric conversion elements and references T11 to T44 designate first switching elements (TFTs). As shown, the photoelectric conversion elements P11 to P44 are connected to bias lines Vs1 to Vs4 and a first readout device 22 and a second readout device 23 apply given biases to them. Gate electrodes of the TFTs are connected to gate lines Vg1 to Vg4 and the gate lines are connected to a first gate drive unit 20 and a second gate drive unit 21. Moreover, as shown, source or drain electrodes of the TFTs are connected to common signal lines Sig1 to Sig8. The Sig1 to Sig4 are connected to the first readout device 22 and similarly Sig5 to Sig8 are connected to the second readout device 23.

The radiographic imaging apparatus of the present invention is constructed of a combination of a radiographic imaging substrate, on which there are arranged optical sensors of MIS-TFT structure each formed of an MIS-type photoelectric conversion element and a switching TFT, and phosphors for converting radiation to visible light, and others including a principle of driving are the same as those of the conventional art. Therefore, their description is omitted here.

As shown, in the radiographic imaging substrate of this embodiment, gate lines are formed in a first electrode layer 11 in a pixel area and in a second electrode layer in a TCP-D connection pad portion 10 and are connected together via contact holes. In addition, a guard ring 24 is formed in a region between a region where there is formed a phosphor layer 19 including a pixel area 2 and an edge of an insulating substrate 1. The bias lines (Vs lines), the gate lines (Vg lines), and the signal lines (Sig lines) are connected to the guard ring 24. In this regard, it is assumed that the guard ring is a conductive member formed substantially in a ring shape around the pixel area for the purpose of preventing an electrostatic destruction of the pixel area in the present invention.

Furthermore, as shown in the cross section, the guard ring 24 is formed of a first electrode layer 11, a first insulating layer 12, and a first semiconductor layer 13 similarly to the MIS-type photoelectric conversion element, with the lines connected to the guard ring 24 via a doping semiconductor layer 14 and the doping semiconductor layer 14 arranged separately from the lines.

It should be noted here that the first semiconductor layer 13 has a characteristic of a high resistance under no incident light and of a low resistance under incident light due to holes and electrons generated in the layer, similarly to the first embodiment.

Therefore, for example, even if the insulating substrate 1 is electrically charged in a manufacturing process, the resistance of the connection wiring is low since the product is manufactured in an environment in which light is incident on the insulating substrate 1 and a potential difference between the lines is hard to occur since all of the bias lines (Vs lines), the gate lines (Vg lines), and the signal lines (Sig lines) are connected together via the guard ring 24. Therefore, it is possible to prevent static electricity generated in the manufacturing process from passing through the lines and damaging the photoelectric conversion elements or the TFTs.

Furthermore, a panel inspection using TCP connection pads 9 and 10 is performed in an environment in which no light is incident on the panel, and therefore the light has no influence on the inspection.

Furthermore, as shown in FIG. 7, there is provided a cut section (indicated by a dashed line in FIG. 7) of the insulating substrate 1 between the pixel area 2 and the guard ring 24. Therefore, on the radiographic imaging substrate after cutting, the lines are separated from each other and this arrangement has no influence on the operation of the radiographic imaging apparatus.

As stated above, the guard ring 24 having at least the photoelectric conversion layer (first semiconductor layer 13) is formed in a region between the region where there is formed the phosphor layer 19 including the pixel area 2 and the edge of the insulating substrate 1. It is then connected to one of the bias lines (Vs lines), the gate lines (Vg lines), and the signal lines (Sig lines) and a cut section of the insulating substrate is provided between the pixel area 2 and the guard ring 24, thereby offering an effect of preventing deterioration in device performance and device destruction from being caused by static electricity even if the substrate is electrically charged in a manufacturing process.

While the lines and the guard ring 24 have been connected via the hole blocking layer (doping semiconductor layer 14) in this embodiment, it can be an ohmic contact layer (doping semiconductor layer 14) for forming a switching element.

Moreover, while the MIS-type photoelectric conversion element has been used as the semiconductor conversion element in this embodiment, the PIN-type photoelectric conversion element is also applicable. Regarding the pixel structure, either type of the following is applicable: a flat type in which a semiconductor conversion element and a switching element are formed in an identical layer and a stacked type in which a semiconductor conversion element is formed on a layer where a switching element is formed.

Third Embodiment

The following describes a third embodiment of a radiographic imaging substrate and a radiographic imaging apparatus according to the present invention with reference to accompanying drawings.

Figure 9:
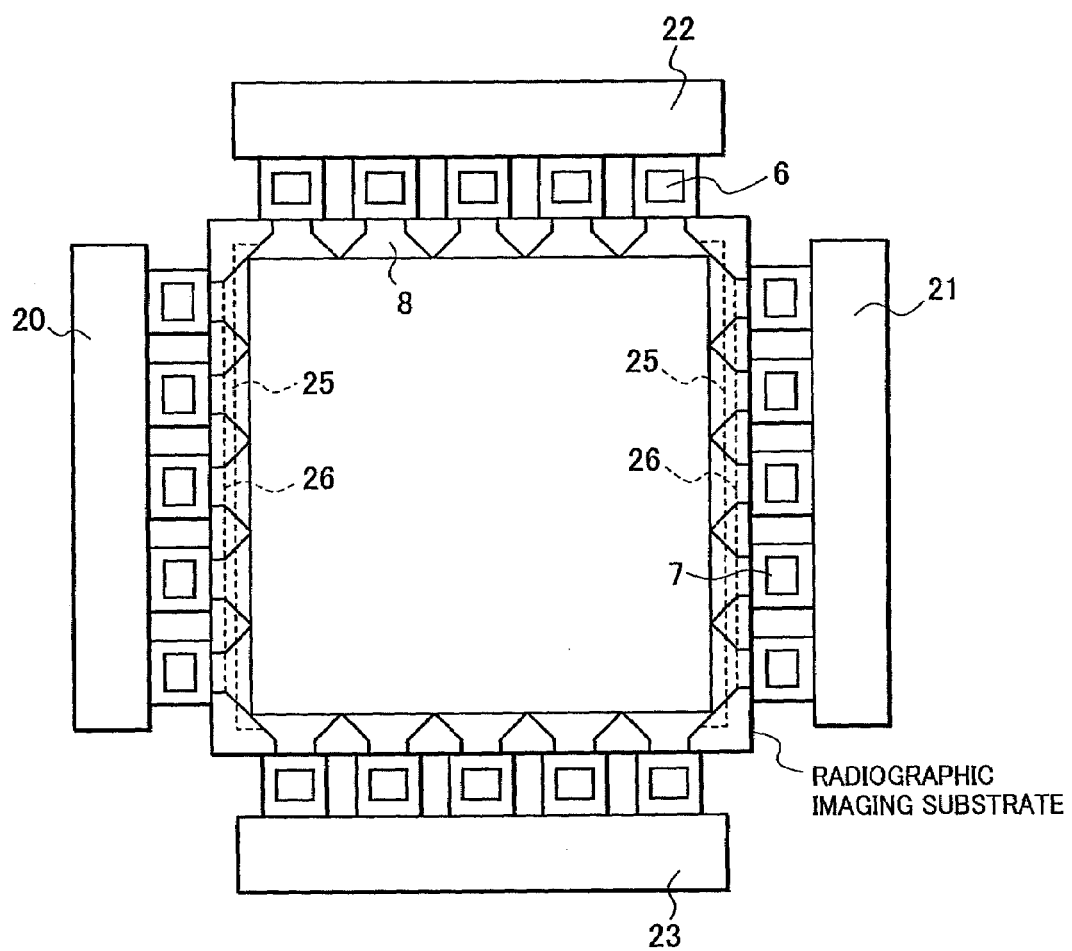
FIG. 9 is a schematic diagram of a radiographic imaging apparatus for explaining a third embodiment of a radiographic imaging substrate and a radiographic imaging apparatus according to the present invention.
Figure 10:
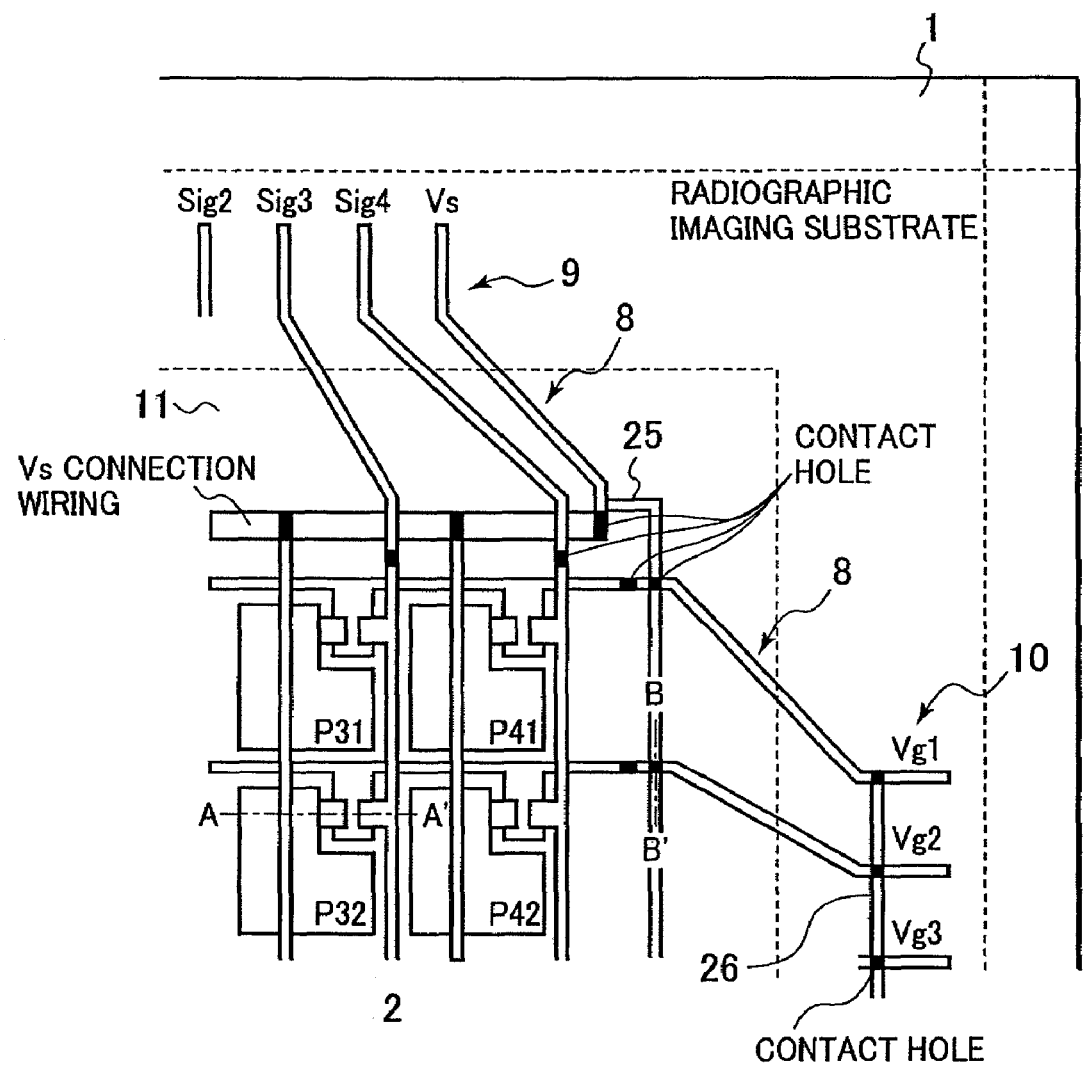
FIG. 10 is an enlarged view of a portion close to a cut section of the radiographic imaging substrate for explaining the third embodiment of the radiographic imaging substrate and the radiographic imaging apparatus according to the present invention.
Figure 11A:
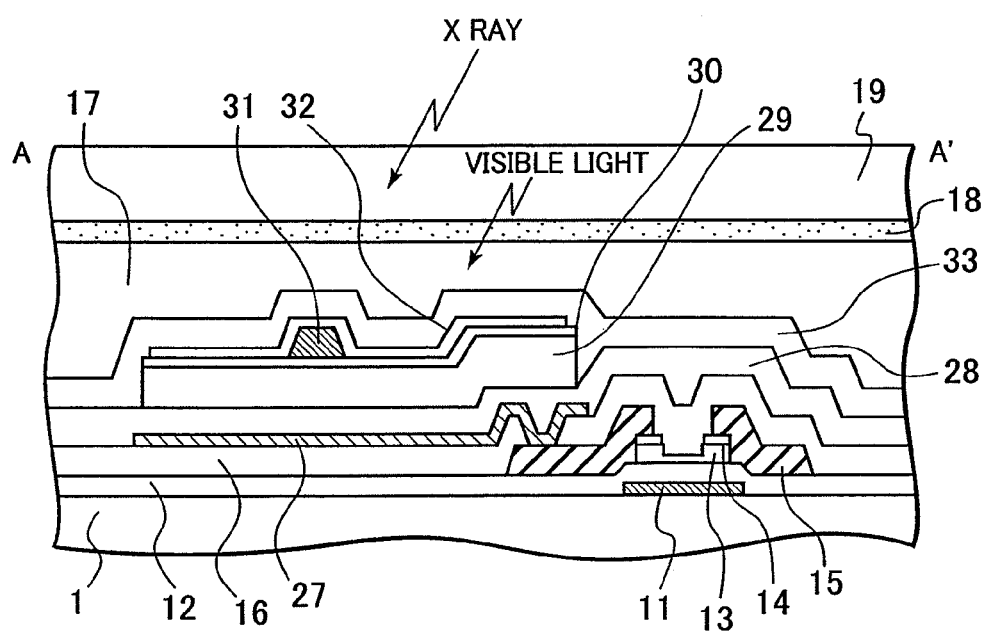
FIG. 11A is a cross section taken on line A-A of FIG. 10 for explaining the third embodiment of the radiographic imaging substrate and the radiographic imaging apparatus according to the present invention.
Figure 11B:
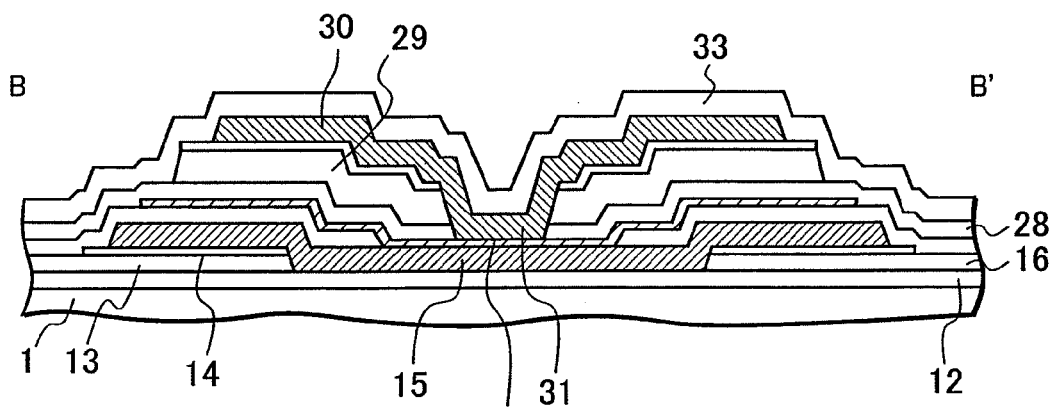
FIG. 11B is a cross section taken on line B-B of FIG. 10 for explaining the third embodiment of the radiographic imaging substrate and the radiographic imaging apparatus according to the present invention.

Referring to FIGS. 9, 10, and 11, there are shown a schematic diagram of the radiographic imaging apparatus of the present invention, an enlarged view of a portion close to a cut section of the radiographic imaging substrate (an insulating substrate), and cross sections of a single pixel and connection wiring 1, respectively. Regarding FIG. 11, FIG. 11A shows the cross section of the single pixel (on line A-A of FIG. 10) and FIG. 11B shows the cross section of the connection wiring 1 (on line B-B of FIG. 10). An equivalent circuit is the same as for the second embodiment and therefore its description is omitted here.

The radiographic imaging apparatus of the present invention is constructed of a combination of a radiographic imaging substrate, on which there are arranged optical sensors of MIS-TFT structure each formed of an MIS-type photoelectric conversion element and a switching TFT, and phosphors for converting radiation to visible light, and others including a principle of driving are the same as those of the conventional art. Therefore, their description is omitted here.

Regarding the layer structure of the radiographic imaging apparatus of this embodiment, as shown in FIG. 10, the TFT includes a gate electrode (first electrode layer 11), a gate insulating layer (first insulating layer 12), a first semiconductor layer 13, an ohmic contact layer (doping semiconductor layer 14), and a source-drain electrode (second electrode layer 15). Each gate line (Vg line) is connected to the first electrode layer 11 where the gate electrode of the TFT is formed and each signal line (Sig line) is connected to the second electrode layer 15 where the source-drain electrode is formed. A second insulating layer 16 is disposed on the TFT and an MIS-type photoelectric conversion element is formed thereon. The MIS-type photoelectric conversion element is formed of a under electrode (third electrode layer 27), an insulating layer (third insulating layer 28), a photoelectric conversion layer (second semiconductor layer 29), a hole blocking layer (second doping semiconductor layer 30), a bias line (fourth electrode layer 31), and an upper electrode (transparent electrode layer 32), with the under electrode connected to the source-drain electrode of the TFT. The photoelectric conversion element and the TFT are then coated with and protected by a fourth insulating layer 33 and an organic protective layer 17.

In the radiographic imaging substrate of this embodiment, bias lines (Vs lines) in both end portions connected to a first readout device 22 and to a second readout device 23 are connected to all gate lines (Vg lines) via first connection wiring 25 in a region where there is formed a phosphor layer 19 including a pixel area 2. In this regard, the gate lines (Vs lines) are connected via Vs connection wiring 25' in a region outside the pixel area 2 and within a region where a phosphor layer is formed. In other words, in this embodiment, all the Vs lines are connected to all the Vg lines via the first connection wiring 25 and the Vs connection wiring 25' in the region where there is formed the phosphor layer 19 including the pixel area 2. Moreover, all the gate lines (Vg lines) are connected together via the first connection wiring 25 in a region between the region where there is formed the phosphor layer 19 including the pixel area 2 and an edge of the insulating substrate 1. Each bias line (Vg line) and each signal line (Sig line) form a contact hole outside the pixel area 2 and connected to the fourth electrode layer 31 forming the bias line (Vg line) via the third electrode layer 27, thereby forming TCP connection pads 9 and 10 in the fourth electrode layer 31. Furthermore, as shown in the cross section, the first connection wiring 25 is formed of the first semiconductor layer 13 and the ohmic contact layer (doping semiconductor layer 14) similarly to the TFT. While second connection wiring 26 is divided at contact holes of the bias lines (Vg lines) here, it may not be divided.

It should be noted here that the first semiconductor layer 13 has a characteristic of a high resistance under no incident light and of a low resistance under incident light due to holes and electrons generated in the layer. Therefore, if it is defined that Ra is a wiring resistance of a bias line (Vs line), Rb is a wiring resistance of a gate line (Vg line), Rp is a wiring resistance of the first semiconductor layer 13 of each connection wiring under incident light, Rd is a wiring resistance of the first semiconductor layer 13 between the gate lines under no incident light, and Rf is a wiring resistance of the ohmic contact layer not divided, the following relations are satisfied:
Ra, Rb<Rf<Rd
Ra, Rb<Rf≦Rp Since the connection wiring has the relation Rf<Rp between the gate lines, the first connection wiring and the second connection wiring are arranged to achieve Rf≦Rp.

Therefore, for example, even if the insulating substrate 1 is electrically charged in a manufacturing process, the resistance of the connection wiring 3 is low since the product is manufactured in an environment in which light is incident on the insulating substrate 1 and a potential difference between the lines is hard to occur since all of the bias lines (Vs lines) and the gate lines (Vg lines) are connected via the first connection wiring 25, the Vs connection wiring 25', and the second connection wiring 26. Therefore, it is possible to prevent static electricity generated in the manufacturing process from passing through the lines and damaging the photoelectric conversion elements or the TFTs.

Moreover, the radiographic imaging apparatus with the radiographic imaging substrate has the phosphor layer 19 formed on the region including the pixel area 2 as shown in FIG. 10 and has no phosphor layer 19 on the region where the second connection wiring 26 is formed. Therefore, in the radiographic imaging apparatus housed in a cabinet (not shown), no external light nor light emitted from the phosphor layer 19 will be incident on the second connection wiring 26, and thus the resistance of the second connection wiring 26 is high and practically the connection wiring has the relations Rf<Rd and Rf<Rp between the gate lines. Therefore, they have no influence on the operation of the radiographic imaging apparatus.

As stated above, a part of the connection wiring (the second connection wiring 26 in this embodiment) having at least the photoelectric conversion layer (first semiconductor layer 13) is formed in the region between the region where there is formed the phosphor layer 19 including the pixel area 2 and the edge of the insulating substrate 1, and the bias lines (Vs lines) and the gate lines (Vg lines) are connected together via the connection wiring (the first connection wiring 25, the Vs connection wiring 25', and the second connection wiring 26), thereby offering an effect of preventing deterioration in device performance and device destruction from being caused by static electricity even if the substrate is electrically charged in a manufacturing process.

Moreover, while the MIS-type photoelectric conversion element has been used as the semiconductor conversion element in this embodiment, the PIN-type photoelectric conversion element is also applicable. Regarding the pixel structure, either type of the following is applicable: a stacked type in which a semiconductor conversion element is formed on a layer where a switching element is formed and a flat type in which a semiconductor conversion element and a switching element are formed in an identical layer.

Fourth Embodiment

Figure 12:
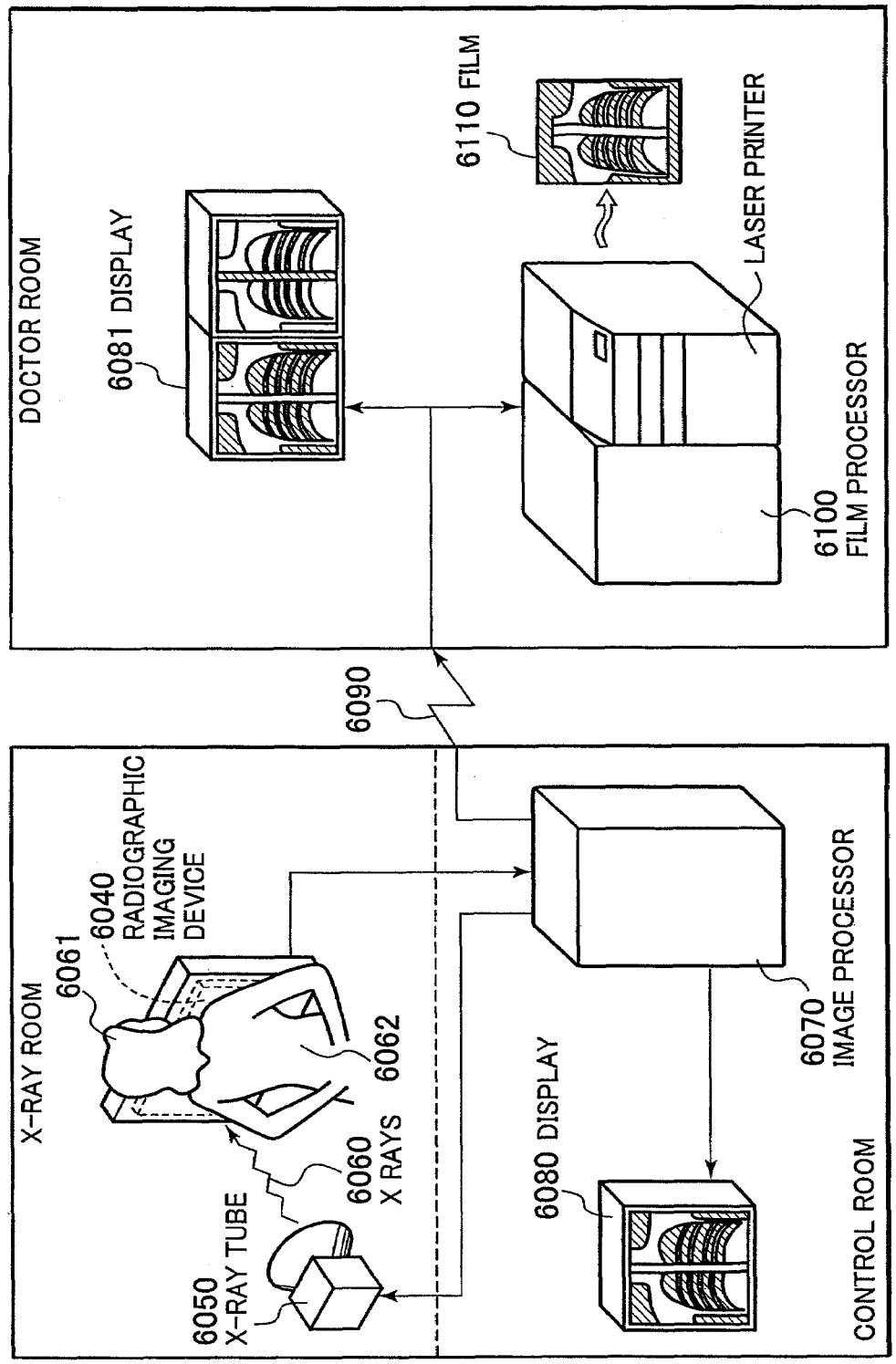
FIG. 12 is a schematic diagram for explaining an application in which the radiographic imaging substrate and the radiographic imaging apparatus of the present invention are applied to an X-ray diagnostic apparatus.
Figure 13:
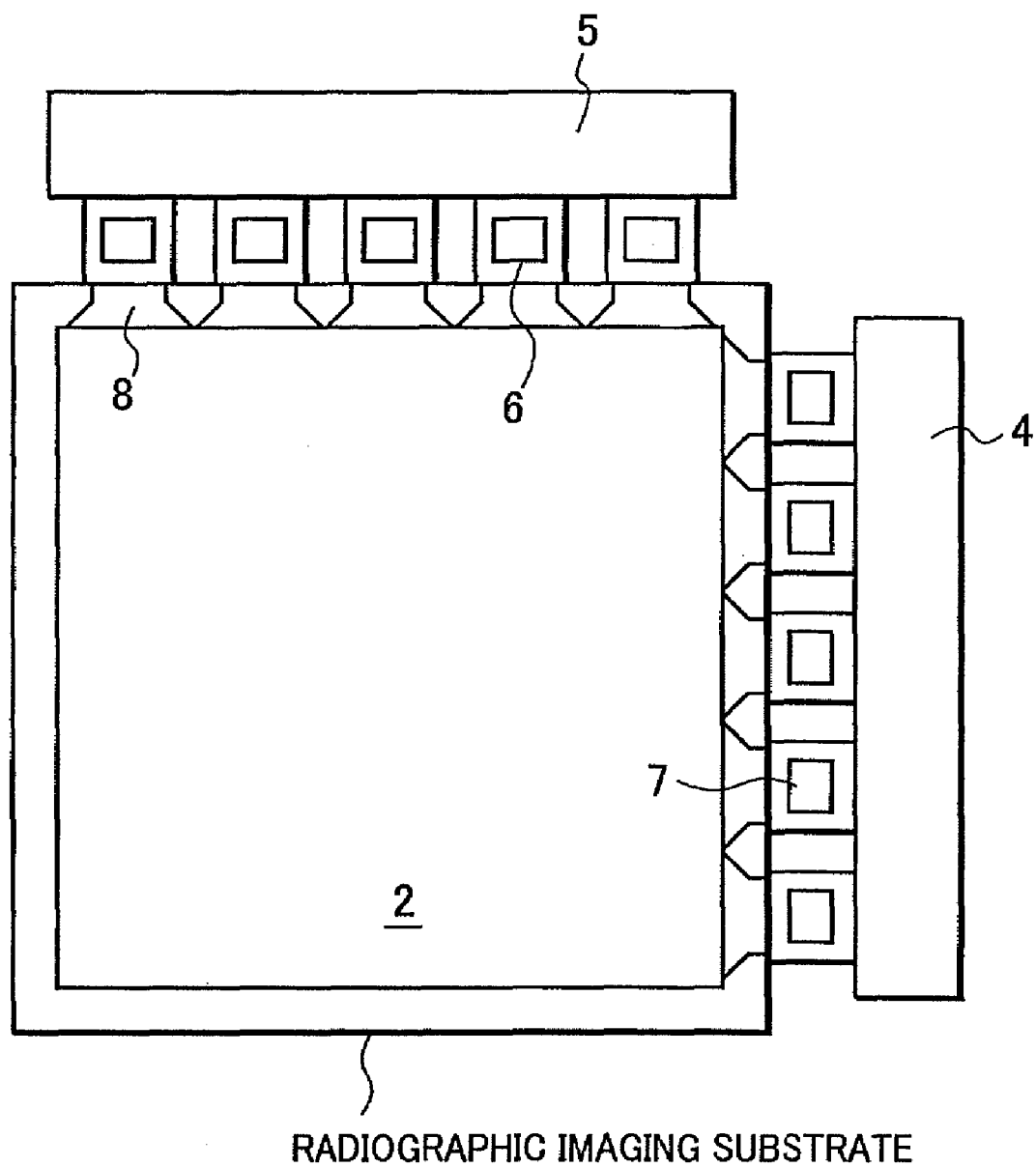
FIG. 13 is a schematic diagram of a conventional radiographic imaging substrate and radiographic imaging apparatus.
Figure 14:
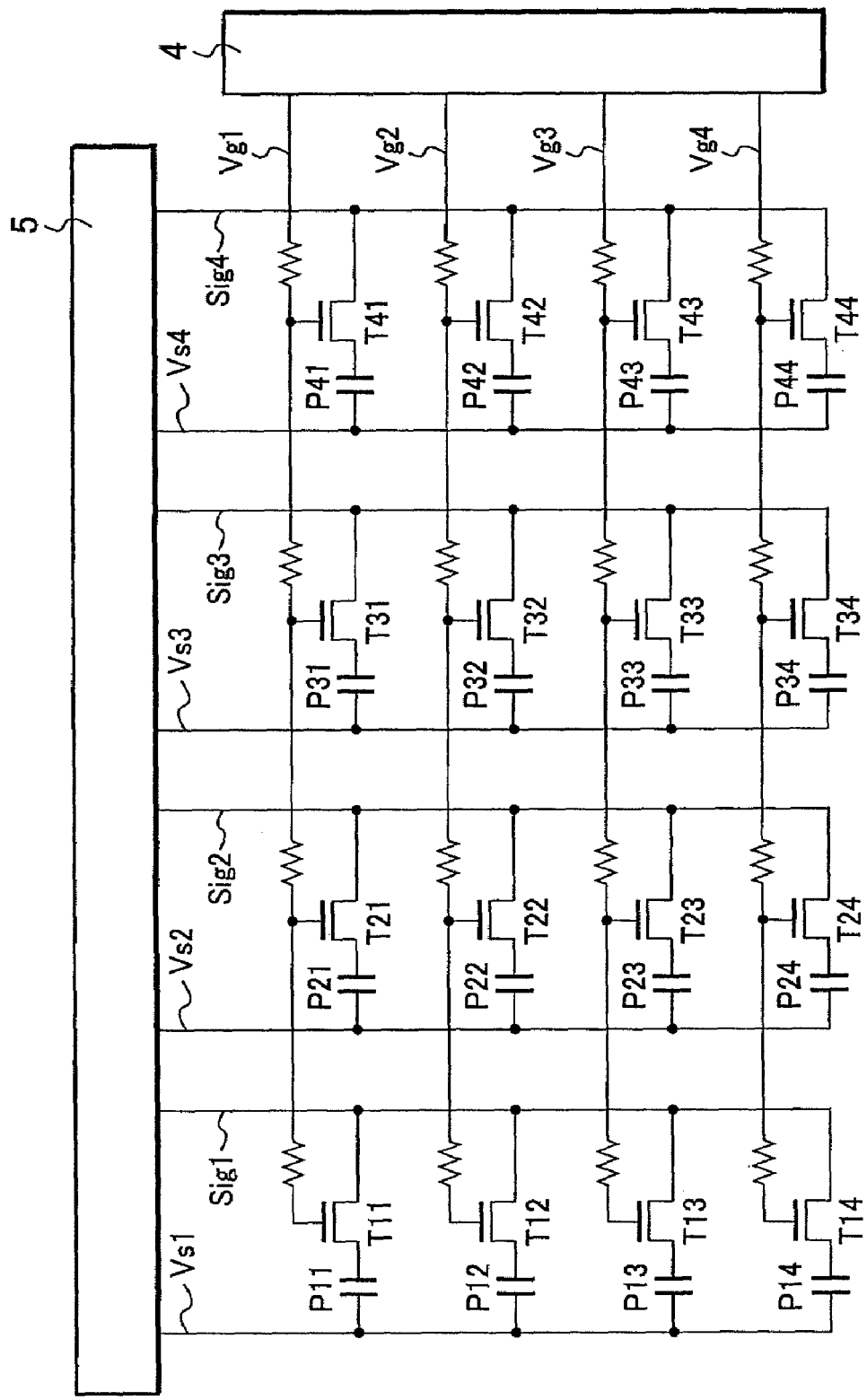
FIG. 14 is an equivalent circuit diagram of the conventional radiographic imaging substrate and radiographic imaging apparatus.
Figure 15:
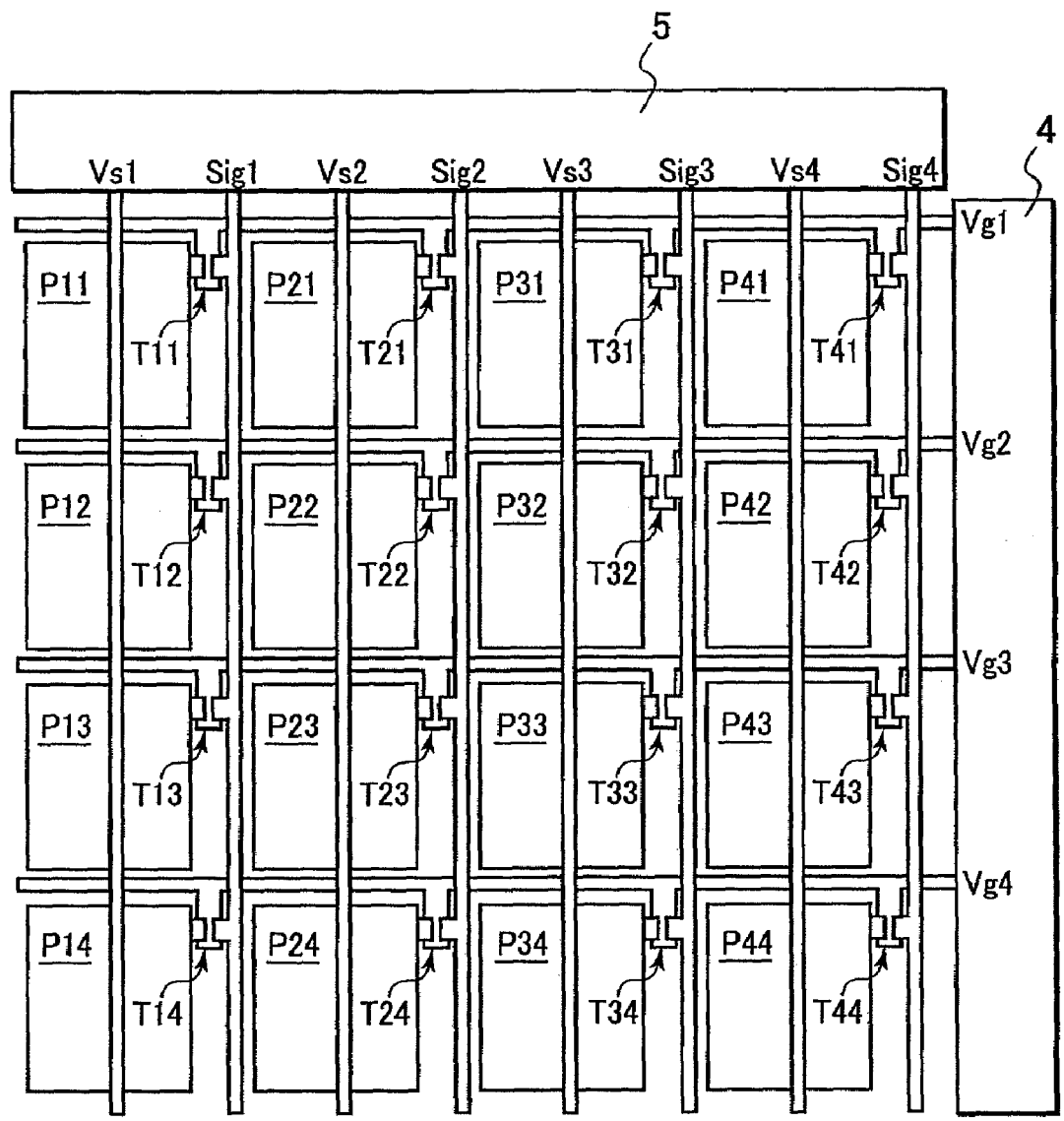
FIG. 15 is a plan view of the conventional radiographic imaging substrate and radiographic imaging apparatus.
Figure 16:
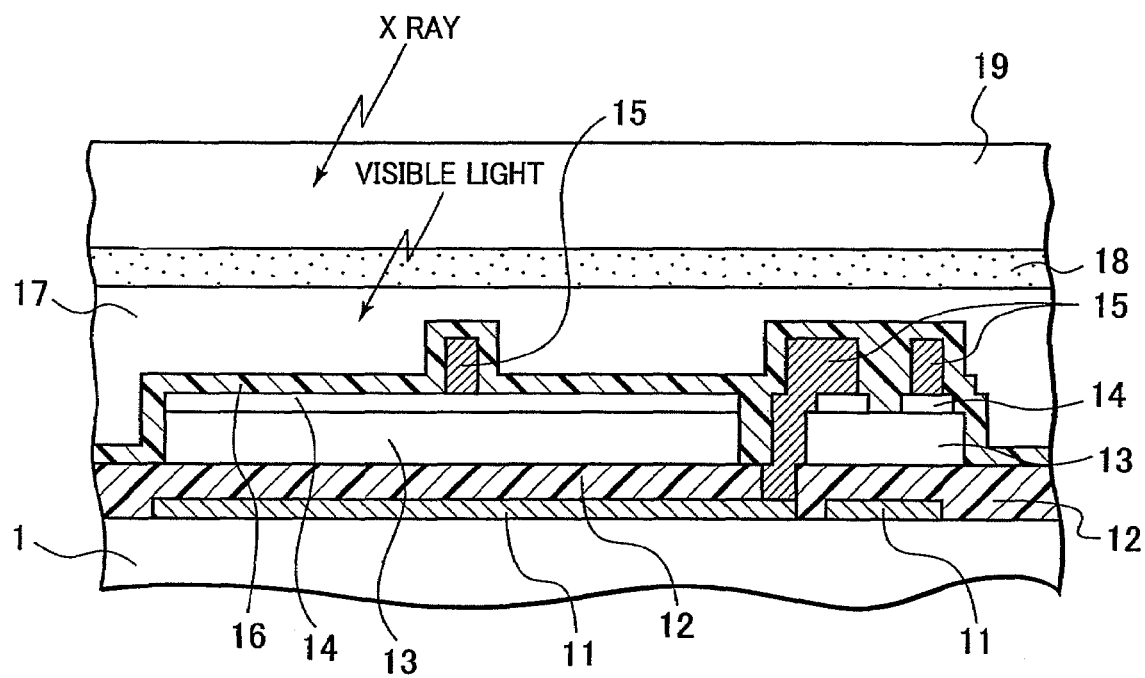
FIG. 16 is a cross section of a single pixel of the conventional radiographic imaging substrate and radiographic imaging apparatus.
Figure 17:
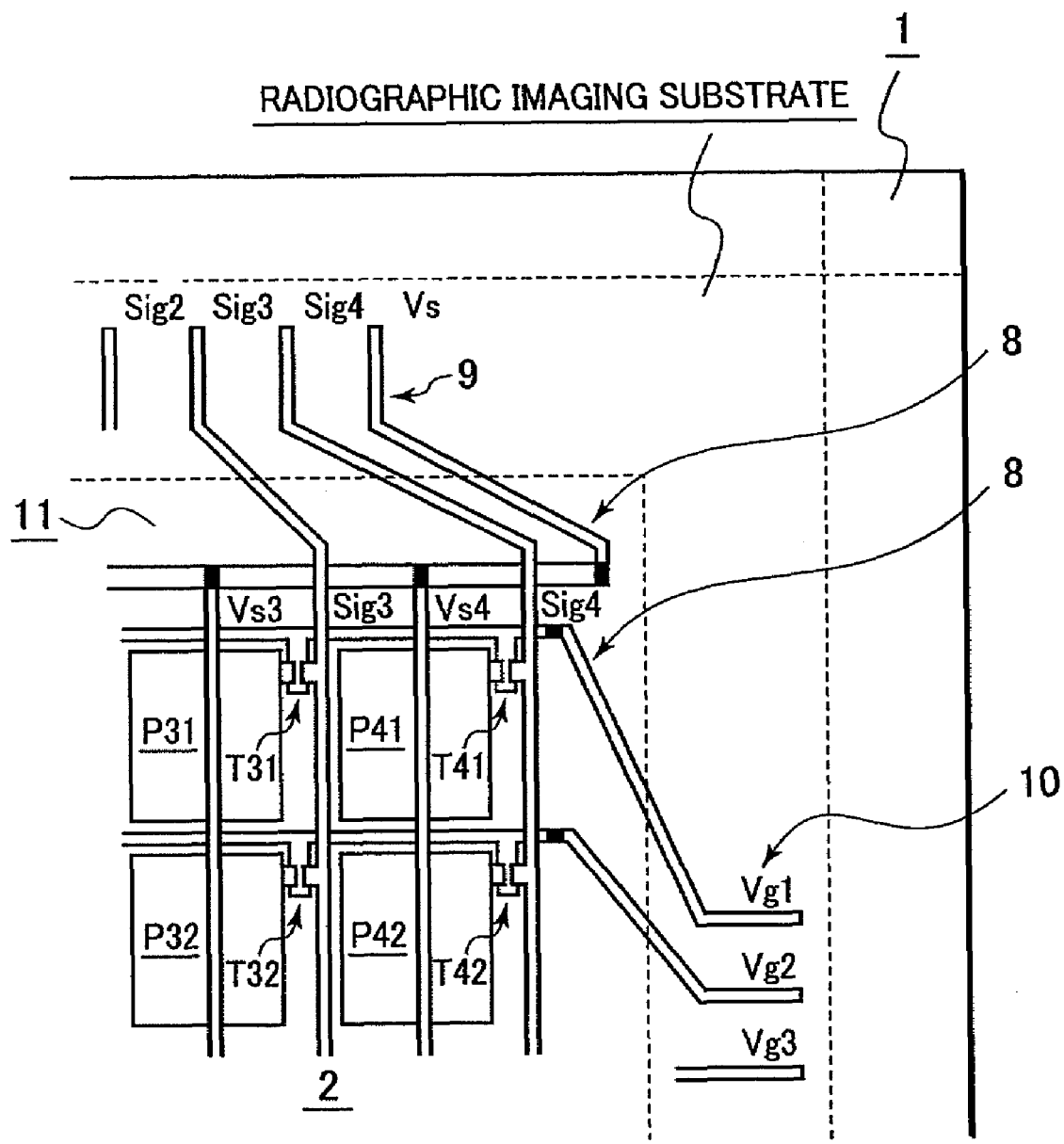
FIG. 17 is an enlarged view of a portion close to a cut section of the conventional radiographic imaging substrate.

Referring to FIG. 12, there is shown an application in which a radiographic imaging substrate and a radiographic imaging apparatus according to the present invention are applied to an X-ray diagnostic system.

X rays 6060 generated in an X-ray tube 6050 pass through a chest 6062 of a patient or subject 6061 and impinge on a radiographic imaging apparatus 6040 provided with a scintillator in its upper portion.

The incident X rays include information on the inside of the body of the patient 6061. The scintillator emits light in response to the incidence of the X rays and photoelectrically converts them to acquire electrical information. This information is subjected to digital conversion and then to image processing using an image processor 6070 as signal processing means, whereby it can be observed on a display 6080 as display means in a control room.

Furthermore, the information can be transferred to a remote location by using transmission processing means such as a telephone line 6090 and can be displayed on a display 6081 as display means in a doctor room in another place or stored in recording means such as an optical disk, whereby a doctor in a remote location can diagnose the patient.

Still further, a film processor 6100 as the recording means can record the information into a film 6110 as a recording medium.

While the present invention has been described with reference to exemplary embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

This application claims priority from Japanese Patent Application No. 2004-177009 filed Jun. 15, 2004, which is hereby incorporated by reference herein.

What is claimed is:

1. A radiographic imaging apparatus, comprising:
   a photoelectric conversion substrate having a first region including a pixel area where there are arranged a plurality of pixels each having a photoelectric conversion element and a switching element connected to the photoelectric conversion element in a matrix formed on an insulating substrate, and a plurality of lines including at least a bias line for applying a bias to said photoelectric conversion element and a gate line for supplying a driving signal to said switching element;
   a wavelength conversion element for conveying radiation to light that can be detected by said photoelectric conversion element, said wavelength conversion element being arranged according to said first region; and
   a semiconductor layer connected to at least said plurality of lines of one type, that one type being said bias lines or said gate lines, wherein at least a part of said semiconductor layer is arranged in a second region between said first region and an edge of said insulating substrate, and said semiconductor layer is connected to said gate line and said bias line, and said gate lines are connected together via said semiconductor layer in said second region.

2. A radiographic imaging apparatus according to claim 1, wherein said lines further include a signal line for reading electric charges conveyed in said photoelectric conversion element, and wherein said semiconductor layer is connected to said plurality of lines of all types, said types being said bias line, said gate line, and said signal line.

3. A radiographic imaging apparatus according to claim 2, wherein said photoelectric conversion element is arranged over said switching element.

4. A radiographic imaging system, comprising:
   a radiographic imaging apparatus according to claim 1;
   signal processing means for processing signals from said radiographic imaging apparatus as an image;
   recording means for recording signals from said signal processing means;
   display means for displaying signals from said signal processing means; and
   transmission processing means for transmitting signals from said signal processing means.

5. A radiographic imaging apparatus according to claim 1, further comprising a doping semiconductor layer connected to at least said plurality of lines of one type, that one type being said bias lines or said gate lines,
   wherein if it is defined that Ra is a wiring resistance of said bias line, Rb is a wiring resistance of said gate line, Rp is a resistance of said semiconductor layer between said lines under incident light, Rd is a resistance of said semiconductor between said lines under no incident light, Re is a wiring resistance of the doping semiconductor layer of the connection wiring between the lines, and Rf is a resistance of said doping semiconductor layer between said lines, the following relations are satisfied:
   Ra, Rb<Re, Rf<Rd
   Ra, Rb<Re, Rf<Rp
   or Ra, Rb≦Rp<Re, Rf.

6. A panel for a radiographic imaging apparatus, comprising:
- a photoelectric conversion substrate having a first region including a pixel area where there are arranged a plurality of pixels each having a photoelectric conversion element and a switching element connected to said photoelectric conversion element in a matrix formed on an insulating substrate, and a plurality of lines including at least a bias line for applying a bias to said photoelectric conversion element and a gate line for supplying a driving signal to said switching element; and
- a semiconductor layer connected to at least said plurality of lines of one type, that one type being said bias lines or said gate lines, wherein at least a part of said semiconductor layer is arranged in a second region between said first region where there should be arranged a wavelength conversion element and an edge of said insulating substrate, and said semiconductor layer is connected to said gate line and said bias line, and said gate lines are connected together via said semiconductor layer in said second region.

7. A method of manufacturing a radiographic imaging apparatus comprising:
- a step of forming a photoelectric conversion substrate having a first region including a pixel area where there are arranged a plurality of pixels each having a photoelectric conversion element and a switching element connected to the photoelectric conversion element in a matrix on an insulating substrate and a switching element connected to the photoelectric conversion element, and a plurality of lines including at least a bias line for applying a bias to the photoelectric conversion element and a gate line for supplying a driving signal to the switching element, wherein said step of forming the photoelectric conversion substrate includes a step of forming a semiconductor layer connected to at least the plurality of lines of one type, that one type being the bias lines or the gate lines in a second region between the first region and an edge of the insulating substrate, and the semiconductor layer is connected to the gate line and the bias line, and the gate lines are connected together via the semiconductor layer in the second region;
- a step of forming a wavelength conversion element for converting radiation to light that can be detected by the photoelectric conversion element according to the first region; and
- a step of housing the photoelectric conversion substrate and the wavelength conversion element in a cabinet.

8. A method of manufacturing a radiographic imaging apparatus according to claim 7, wherein each of the pixels has the photoelectric conversion element and a switching element connected to the photoelectric conversion element, and the lines further include a signal line for reading electric charges converted in the photoelectric conversion element, wherein the semiconductor layer is connected to the plurality of lines of all types, those types being the bias line, the gate line and the signal line.

9. A method of manufacturing a radiographic imaging apparatus according to claim 8, wherein the photoelectric conversion element is arranged over the switching element.

* * * * *